United States Patent [19]

Mazzullo et al.

[11] Patent Number: 4,985,806

[45] Date of Patent: Jan. 15, 1991

[54] POWER SUPPLY STRUCTURE

[75] Inventors: Raymond Mazzullo; Brian R. Van Zyl, both of Cape Town, South Africa

[73] Assignee: Multitech Systems (Proprietary) Limited, Cape Town, South Africa

[21] Appl. No.: 418,322

[22] Filed: Oct. 6, 1989

[30] Foreign Application Priority Data

Oct. 14, 1988 [ZA] South Africa .......................... 88/7685

[51] Int. Cl.[5] .................................................. H05K 7/00

[52] U.S. Cl. ...................................... 361/392; 307/150; 361/380; 361/393; 361/396; 361/407; 363/142; 363/146; 439/131; 439/140; 439/224

[58] Field of Search ........................... 174/57; 307/150; 363/142–143, 146; 361/331, 333, 334, 358, 380, 391, 392, 394, 396, 407, 426; 439/131, 139, 140, 208, 209, 224, 628, 638, 646, 709; 320/2

[56] References Cited

U.S. PATENT DOCUMENTS 2,963,676 12/1960 Sneesby et al. ....................... 439/209
4,017,137 4/1977 Parks .................................... 439/209
4,318,156 3/1982 Gallagher ............................ 361/358
4,494,809 1/1985 Soloman ............................. 439/638
4,722,693 2/1988 Rose .................................... 439/139

*Primary Examiner*—Gregory D. Thompson
*Attorney, Agent, or Firm*—Cushman, Darby & Cushman

[57] ABSTRACT

A power supply structure is disclosed in which a base member has first and second sets of plug pin receiving openings with electrically conductive sockets behind the openings. Each first set is grouped with a second set, and the sets are provided with power from separate sources e.g. clean and contaminated power. Socket modules each of which includes electrically conductive pins can be plugged into the openings. Each socket module has plug pin receiving openings for receiving plugs on power leads. In one form each socket module is unplugged from the base member, turned through 180 degrees and plugged into the base member again to change from one type of power to another. In a further form the base member includes switches which provide power selectively to the socket behind the first and second sets of openings.

20 Claims, 5 Drawing Sheets

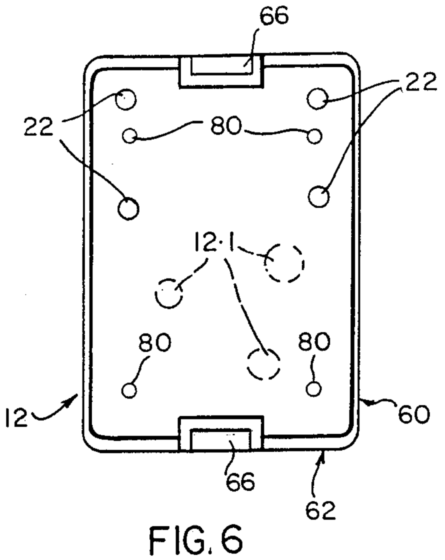
FIG. 6
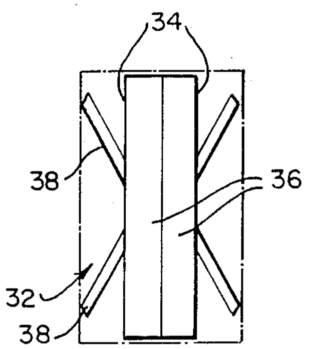
FIG. 4
FIG. 7
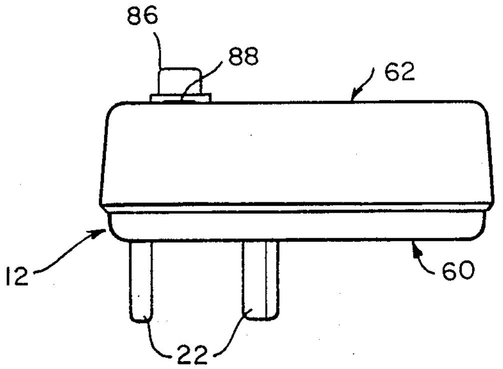
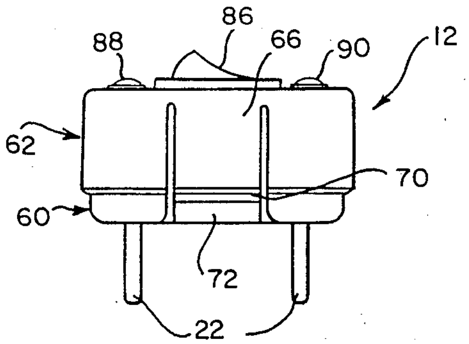
FIG. 8

POWER SUPPLY STRUCTURE

FIELD OF THE INVENTION

THIS INVENTION relates to a power supply structure particularly, but not exclusively, for a desk.

BACKGROUND TO THE INVENTION

Most commercial and industrial businesses, and also research organizations, are nowadays heavily dependant on electronic data processing equipment in the form of electronic calculators, word processors, personal computers, which in some instances are linked directly to mainframes, and terminals which are linked directly to mainframes. Data processing equipment, for efficient operation, requires clean power, that is, power which is free of surges, spikes and other irregularities in voltage and current. Such power is expensive to provide and it is not generally desirable to use it for non-sensitive equipment such as typewriters and tasklights as this greatly increases the size of the supply installation required.

The equipment found in an office complex is often manufactured in a number of different countries. Most countries in the world have their own style of power plug. Two and three pin plugs are widely used. Two pins plugs are mainly used for non-earthed 100–110 volt supplies and three pin plugs for earthed supplies of higher voltage e.g. 220–250 volts. However, there are two pin plugs for use on 220–250 volt and three pin plugs for 100–110 volt supplies. The spacing between and the size of the pins of two pin plugs varies from country to country. Likewise the cross-sectional shapes of the pins of three pin plugs, and their spacing and position, varies from country to country.

Most electronic equipment is supplied with a power cable one end of which is within the casing of the electronic equipment and the other end of which has a sealed plug on it. The plug is that in use in the country of manufacture. The end user in another country, not having power sockets of the appropriate type, quite often cuts off the plug and attaches a plug of the type in use in his country. The problem with this is that, if the electrical connections are not properly made or come loose, arcing can occur. This introduces irregularities into the clean power supply which affects not only the piece of equipment in question but all other equipment being fed from that line.

OBJECTS OF THE INVENTION

The main object of the invention is to provide a versatile power supply structure which supplies clean and contaminated power to a work station.

Another object of the present invention is to provide a power supply structure which can supply clean power to commercially supplied electronic data processing equipment from various countries without the necessity of removing the manufacturer's factory fitted plug from the power cable of the equipment.

Yet another object of the present invention is to provide a power supply system including socket modules into which power cable can be plugged, and which modules supply clean or contaminated power as required.

BRIEF DESCRIPTION OF THE INVENTION

According to the present invention there is provided a power supply structure which comprises a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings being grouped so that each first set is associated with a second set, first means electrically connecting the sockets behind the first sets of openings for supplying power to these sockets, second means electrically connecting the sockets behind the second sets of openings for supplying power to the sockets, and a plurality of modules each of which includes pins for insertion into said sets of openings and plug pin receiving openings into which plugs on power leads can be inserted.

In one form each module has one set of pins and can, in a first position of orientation with respect to the base member, be plugged into a selected one of said first sets and can, in a second position of orientation, be plugged into a selected one of said second sets. In this form the pins of each module preferably project downwardly from a bottom wall thereof and said plug pin receiving openings are in the top wall thereof, said sets of plug pin receiving openings of the base member being in a first horizontal wall of said base member with said plug pin receiving sockets and said first and second means below said wall and between it and a second, lower horizontal wall of the base member.

In another constructional form each module has first and second sets of pins for insertion into said sockets, the number of pins of each module equalling the total number of openings of grouped first and second sets of openings, and the base member further including switch means associated with each grouped first and second set for selectively supplying power to either the sockets behind the first group of openings or the sockets behind the second group of openings. In this constructional form it is preferred that said first and second sets of plug pin receiving openings are in an upright wall of the base member and that said base member includes a base wall which incorporates resiliently deflectable tongues for urging said modules upwardly, said base member further including retaining elements against which said tongues press said modules, the modules including resiliently displaceable latching elements which co-operate with said retaining elements.

BRIEF DESCRIPTION OF THE DRAWINGS

For a better understanding of the present invention, and to show how the same may be carried into effect, reference will now be made, by way of example, to the accompanying drawings in which:

FIG. 4 is a top plan view of a shutter;

FIGS. 6, 7 and 8 are respectively an underneath plan view, a side elevation and an end elevation of a socket module;

DETAILED DESCRIPTION OF THE DRAWINGS

Figure 1:
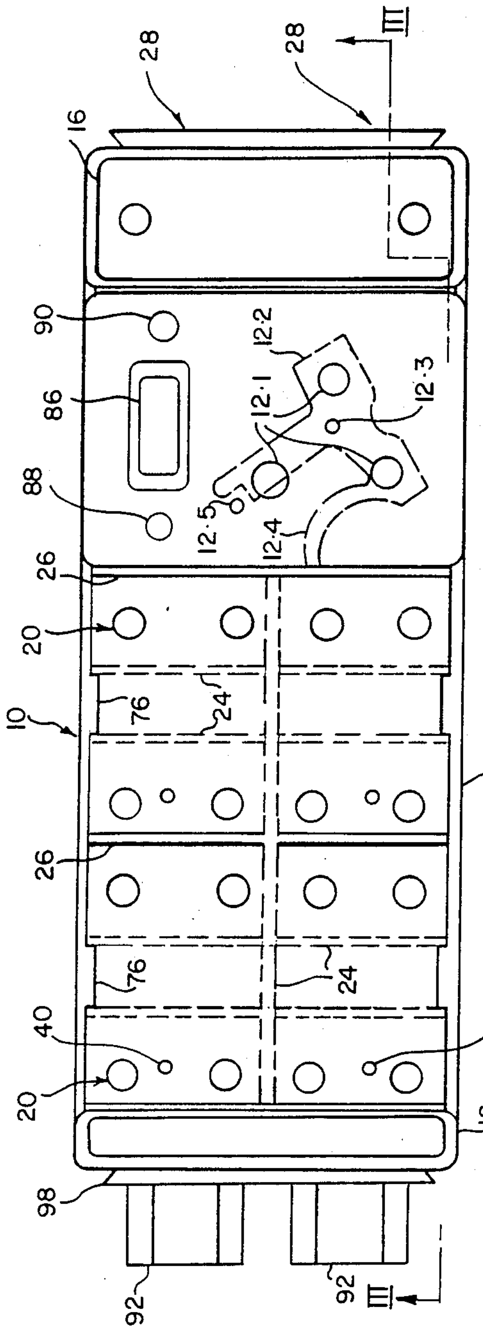
FIG. 1 is a top plan view of a power supply structure for a desk.
Figure 3:
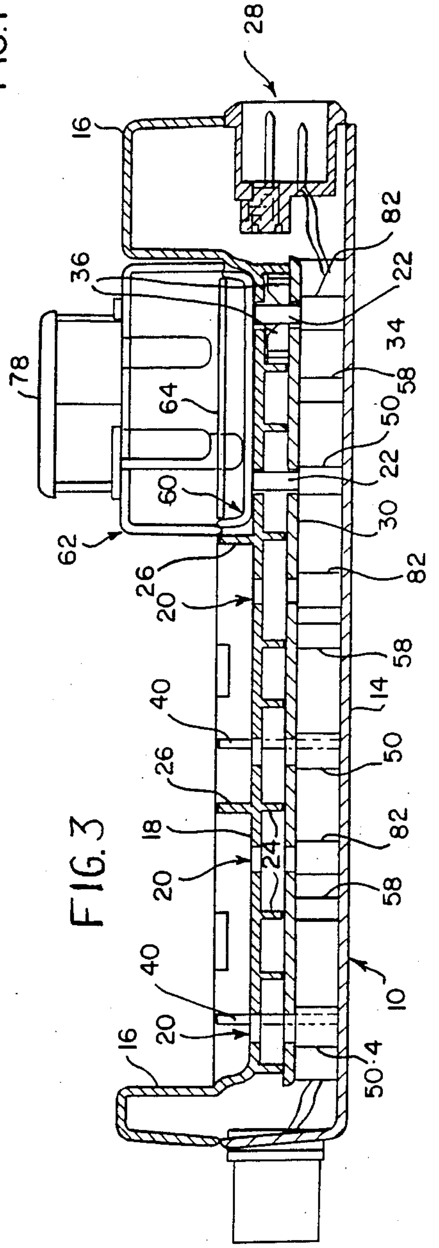
FIG. 3 is a diagrammatic section on the line III—III of FIG. 1.
Figure 2:
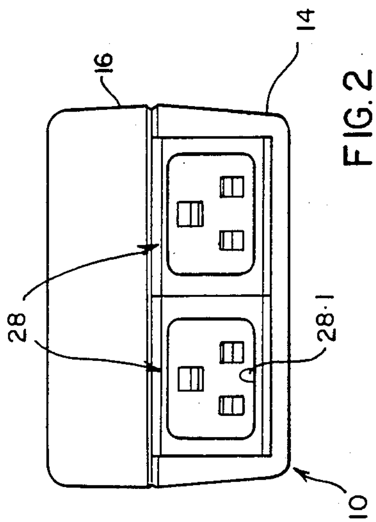
FIG. 2 is an end elevation of the supply structure of FIG. 1.

Referring firstly to FIGS. 1, 2 and 3, the power supply structure illustrated comprises a base member 10 and a plurality of socket modules 12. In the illustrated embodiment the base member can receive three socket modules of which only one is shown in each of FIGS. 1 and 3. It will be understood that the base member 10 can be made longer so that it can receive more socket modules 12 than three.

The base member 10 comprises an upwardly open tray 14 and a trough-like cover 16. Screws (not shown) fasten the tray 14 and the cover 16 together. The cover 16 includes a horizontal base 18 which has in it openings 20 through which electrically conductive pins 22 of the socket modules 12 pass. On the underside of the base 18 there are longitudinal and transverse ribs 24. The arrangement of those ribs 24 which are below the spaces which receive the left hand and centre socket modules can best be seen in FIG. 1. The ribs below the right socket module receiving space are similarly arranged. Two transverse ribs 26 on the top face of the base 18 separate the three socket module receiving spaces from one another.

Sockets 28 are provided at the right hand end of the base member 10 for receiving power plugs (not shown) which supply clean and contaminated power. Clean power is derived from a battery source and is devoid of voltage spikes, power surges and other irregularities which would interfere with the operation of electronic equipment such as word processors and computers. Contaminated power is mains power and can be used for all other office equipment such as typewriters, task lights etc. The sockets 28 are differently constructed, for example, by the provision of the obstruction 28.1 in one of them, so that it is impossible to insert a clean power plug into the contaminated power socket. The pins of the sockets 28 (see particularly FIG. 2) lie horizontally and are of the sixteen amp type. It is possible for the pins to lie vertically and be of the 10 amp type.

Below the horizontal base 18 there is a horizontal partition 30 (FIG. 3) which is rectangular in plan and fits into the tray 14. The ribs 24 are in contact with the partition 30, the ribs 24, base 18 and partition 30 together defining closed compartments in which shutters 32 (FIGS. 3 and 4) are confined. In FIG. 4 the chain dotted line diagrammatically illustrates the boundary of a compartment. The shutters 32 prevent access being had to the bus bar structure which lies below the partition 30 (and which will be described in more detail hereinafter) through the openings 20 in the base 18 in the absence of the socket module 12. If reference is made to FIG. 4 it will be noted that each shutter comprises two mouldings 34 of synthetic plastics material. Each moulding has a ramp surface 36 (see also FIG. 3) and two arms 38. The ramp surfaces 36 slope down towards one another and form a V-shaped. The arms 38 bear on the ribs 24 and urge the mouldings 34 towards one another. When an entering pin 22 encounters the ramp surfaces 36, the mouldings 34 are urged apart so that the pin can reach the bus bar construction. The arms 38 are splayed apart and, as soon as the pin is withdrawn, urge the mouldings back to the position shown in FIG. 4 so that the bus bar construction is shielded. The mouldings 34 of the shutter 32 illustrated in FIG. 4 are of the same width and are used in compartments the openings 20 of which are on the compartment centre line. In certain of the compartments the openings 20 are offset to one side and mouldings 34 of unequal width are then used. This will best be understood by referring to the arrangement of the openings 20 with respect to the ribs 24 in FIG. 1.

Vertical non-conductive pins 40 are moulded integrally with the base member 10, the pins 40 extending upwardly through the partition 30 and through the base 18 so that their upper ends are in the spaces which receive the modules 12.

Figure 5:
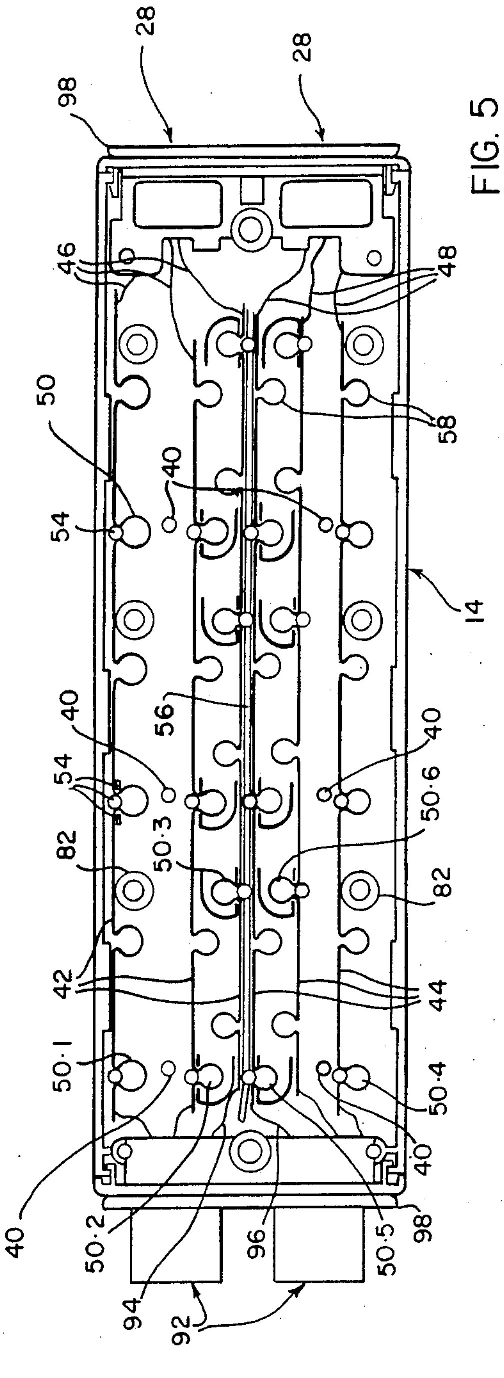
FIG. 5 is a top plan view of a number of bus bars and the components associated therewith.
Figure 11:
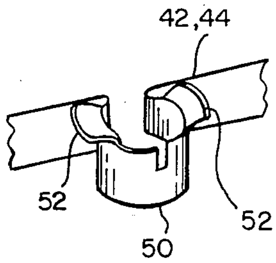
FIG. 11 is a pictorial view of part of a bus bar.

The bus bar construction shown in FIG. 5 comprises three bus bars 42 for the clean supply and three bus bars 44 for the contaminated supply. Wires 46 form the electrical connections between the pins of the contaminated supply socket 28 and the bus bars 42 and wires 48 form the connections between the pins of the clean supply socket 28 and the bus bars 44. Each bus bar 42, 44 comprises a strip of electrically conductive material such as brass which is formed with a number of loops 50 (see also FIG. 11). The upper edge of the portions of the strip which form the loops 50 are flared outwardly to form lips 52 as shown in FIG. 11. The strip material can be fed stepwise through tooling to form the loops 50 and the lips 52 and can then be cut to the desired length. Reference numerals 54 in FIGS. 3 and 5 indicate groups of locating posts which are moulded integrally with the tray 14. The posts 54 locate the loops 50 and prevent the bars 42, 44 being shifted longitudinally. Only one group of three posts is fully illustrated. Walls 56 upstanding from the tray 14 separate the various bus bars from one another to prevent shorting. The partition 30 is supported on the posts 54 and walls 56. The earth bus bars are slightly raised with respect to the neutral and live bus bars e.g. on small platforms provided on the inner surface of the tray 14 whereby the earth pins are the first to make contact and the last to break.

Because the spacing between adjacent rows of openings 20 is uneven (see FIG. 1) the spacing between the loops 50 that are used is also uneven. However, the method of production of the bus bars is such as to produce equally spaced loops. Thus certain loop, such as those designated 58 by way of example, are "dummy" in that they are unused. The dummy loops 58 are those not having groups of posts 54 to locate them. Each loop which is not a dummy loop forms a socket for receiving one of the pins 22. The portions of the bus bars 42 and 44 between the sockets constituted by the loops 50 form means electrically connecting the sockets.

Figure 9:
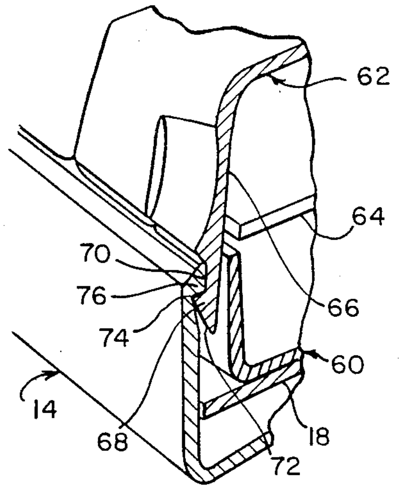
FIG. 9 is a pictorial view illustrating the manner in which a socket module interlocks with a base member.

Each socket module 12 (see FIGS. 6 to 10) comprises a base part 60 and a cover part 62 with a printed circuit board 64 (see particularly FIGS. 9 and 10) located between them. The cover part 62 has an opposed pair of finger operated latch members 66 which are attached, at their upper ends, to the cover part 62 and which extend downwardly to below the upper edge of the base part 60. Each latch member 66 includes a protrusion 68 above which there is a groove 70. The protrusion 68 is formed with a ramp surface 72.

The tray 14 is formed with undercuts 74 on the longitudinal side walls thereof. The configuration of the undercuts 74 is such as to provide a rib 76 (see FIG. 9) which matches the groove 70.

When a socket module 12 is pressed into the base member 10, the ramp surfaces 72 encounter the top edges of the longitudinal side walls of the tray 14 and the latch members 66 are cammed inwardly. Thereafter, the protrusions 68 snap into the undercuts 74 and the modules 12 cannot then be removed from the base member 10 unless the latch members 66 are pressed inwardly. Thus when a plug, such as that shown at 78 in FIG. 3, is pulled from the socket module 12, the socket module 12 cannot be detached from the base member 10.

Figure 10:
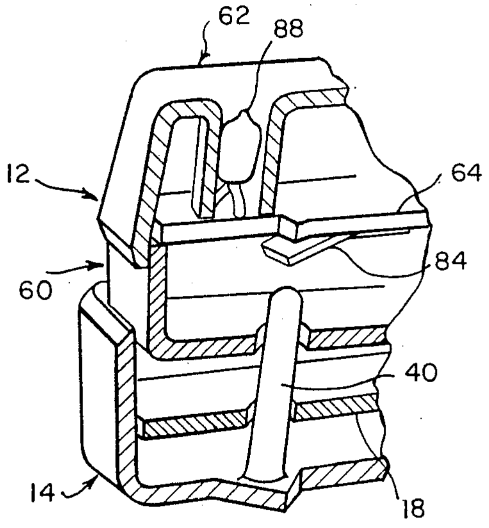
FIG. 10 is a pictorial section through the base member and a socket module.

Neither the latch members 66 nor the undercut 74 have been shown in FIG. 10.

The pins 22 of the socket module 12 shown in FIGS. 6 etc are arranged in pairs, the pins of the left hand pair being further apart than the pins of the right hand pair. The four pins of each socket module comprise one neutral pin, one negative pin and two positive pins. Pairs of holes 80 are provided in the base part 60 for receiving the pins 40. It will be understood that if either pair of holes 80 is blocked-off, then the socket module 12 cannot be pressed into the base in the position of orientation that requires the pins 40 to enter the blocked-off pair of holes 80. Thus the module is dedicated to clean or contaminated power.

Each socket module 12 can be fitted into the base member 10 in two different positions. Thus if reference is made to FIG. 5, when a socket module 12 is pressed into the tray 14 in one position, its pins 22 fit in the sockets constituted by the loops designated 50.1, 50.2 and 50.3. The module is thus supplied with clean power. If the module is then turned through 180 degrees with respect to the tray 14 its pins 22 enter the sockets constituted by the loops 50.4, 50.5 and 50.6 whereby the module is supplied with contaminated power. Thus the base member 10 has sets of first plug pin receiving openings and sets of second plug pin receiving openings. Each first set is grouped with a second set. The power supply system provides clean power to the sockets behind the openings of said first set and contaminated power to the sockets behind the openings of said second set.

It will be understood that one of the two positive pins 22 remains unused regardless of the way the socket module is presented to the base 10. To prevent this unused pin touching any bus bar and shorting out the circuit, short sleeves 82 are moulded integrally with the tray 14 and protrude upwardly therefrom. The unused pin enters one of the sleeves 82 as the module is pressed into the base.

The printed circuit board 64 of each module 12 includes two normally open spring contacts 84 one of which is shown in FIG. 10 and the pins 40 act as selector pins. As the socket module 12 is pressed into place, the appropriate selector pin 40 enters the module and presses one of the spring contacts 84 upwardly and this closes an internal circuit of the socket module.

It will be noted that the module 12 illustrated has a switch 86 and two neon lights 88 and 90. The switch 86 is in circuit with the two spring contacts 84 and has three positions, the centre position being an 'off' position and the end positions both being 'on'. In either position of the module with respect to the base 10 only one of the neon lights 88, 90 can be illuminated. The one which is illuminated is that which is in circuit with the closed contact 84 and the switch 86. Thus while the pins of a module can be in contact with the bus bars, and hence the module is supplied with power, its outlet sockets are 'dead' while the switch 86 is in its centre position. If the switch 86 is then moved to the clean power position but the module is plugged into the contaminated power bus bars, the neon will not light up and no power will be available because the appropriate spring contact 84 is open.

The plug 78 is shown as being a three pin plug with circular section pins and in FIG. 6 the socket module is shown with openings 12.1 to receive the pins of the plug 78. Each socket module can be provided with a plurality of differently shaped and differently arranged openings 12.1 to each other socket module so that a wide variety of plugs can be inserted into one row of modules. The openings 12.1 have a T-shaped shutter 12.2 associated therewith. The shutter is mounted on a pivot 12.3 and includes a restoring arm 12.4 the outer end of which is attached to the wall of the module. A stop is shown at 12.5. When the earth pin encounters the shutter it turns it about the pivot 12.3 thus bowing the resilient arm 12.4. The arm moves the shutter back when the earth pin is removed.

If reference is made to FIGS. 1, 3 and 5 it will be seen that the left hand end of the base member 10 is formed with plugs 92 so that another base member 10 can be plugged into it thereby increasing the number of spaces available for modules 12. The plugs 92 are connected by sets of wires 94, 96 (FIG. 5) to the bus bars 42, 44. It is also possible to fit to the base member modules which incorporate dimmers, timers, DC power supplies, photocells for automatically switching on lamps etc thereby providing special facilities in addition to clean and contaminated AC power. It is also possible to attach leads directly to the plugs 92.

It will be understood that when two bases 10 are connected together, the plugs 92 of one are pushed into the sockets 28 of the other until the end walls of the two bases are juxtaposed. The formations 98 of the bases are then adjacent one another and form a dovetail. A clip (not shown) of channel configuration, and having an internal groove which receives the dovetail, is then pressed onto the bases to prevent them separating accidentally.

The formations 98 can also be used to enable arch-shaped modules to be connected to the right hand end of the base 10, the cables leading to the sockets 28 passing through the arches of these modules. This enables provision to be made for data links or post office telephone lines.

Both power lines leading to the sockets 28 can incorporate devices such as overload protection devices or earth leakage devices. Such devices can themselves be in the form of modules and incorporated in their own housings.

Figure 13:
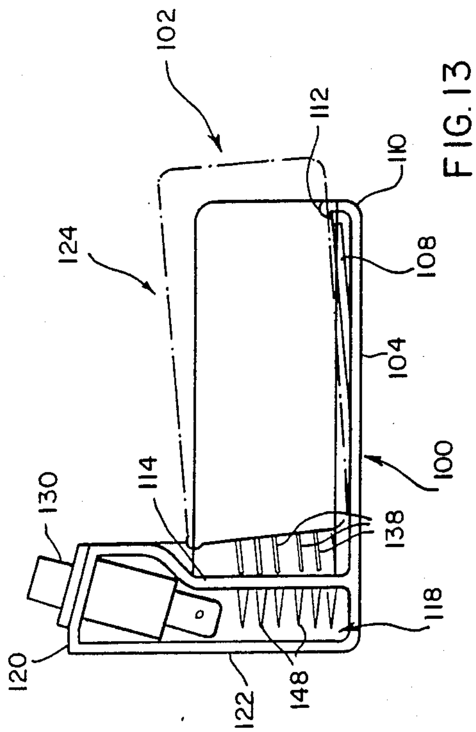
FIG. 13 is a section on the line XIII—XIII of FIG. 12.
Figure 12:
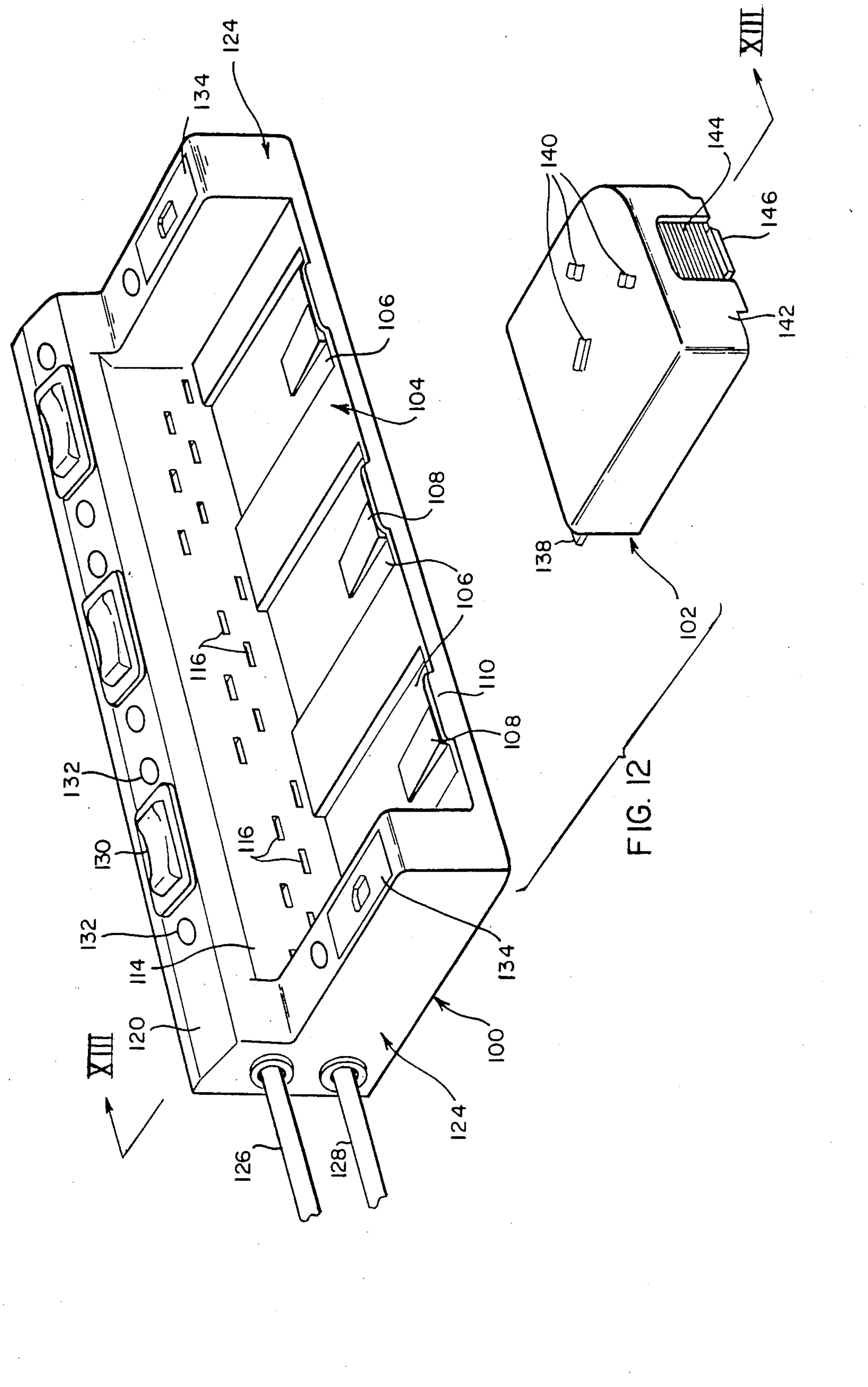
FIG. 12 is a pictorial view of a further form of power supply structure for a desk.

Turning now to FIGS. 12 and 13, the power supply structure illustrated comprises a base member 100 and a plurality of modules one of which is shown at 102. The base member 100 comprises a bottom wall designated 104 which is moulded so as to provide three, in the illustrated embodiment, depressions 106 for receiving modules 102. Resiliently flexible tongues 108 are moulded integrally with the bottom wall 104, there being one tongue 108 in each depression 106. The front wall of each depression is constituted by a retaining element 110 which has a detent 112 (see particularly FIG. 13) along the top edge thereof. The detents 112 protrude towards the tongues 108.

A vertically extending wall 114 constitutes the rear of each depression 106, the wall 114 having a plurality of plug pin openings 116 therein. The wall 114 constitutes part of the walling of a horizontally elongate compartment 118, the compartment being further bounded by a top wall 120, a further vertical wall 122 and part of the bottom wall 104. This is best seen in FIG. 13.

At each end the compartment 118 is extended forwardly by walling which forms two subsidiary compartments designated 124. Cables 126 and 128 bring contaminated and clean power into the compartment 118. Switches 130 and indicator lights 132 are mounted on the top wall 120. Fuses 134 associated with warning lights 136 are located in the compartments 124.

The module 102 has, along the rear face thereof, an array of six pins 138 (see particularly FIG. 13), the arrangement of which corresponds to that of the plug pin openings 116. In the top wall of the module 102 are plug pin openings 140. The openings 140 receive the pins of plugs (not shown) on the ends of power leads.

The vertical wall 142 of the module 102 is formed with an integrally moulded latching element 144 which is thinner than the rest of the wall. More specifically, the latching element 144 is joined to the wall 142 along the upper edge thereof but separated from the wall 142 along the vertical edges and the bottom edge thereof. Thus the latching element 144 can be flexed inwards by finger pressure. A hook 146 which protrudes outwardly is moulded along the lower edge of the element 144.

Behind each opening 116 there is an electrically conductive socket 148 (see FIG. 13).

The electrical supply structure within the compartment 118 can be similar to that described above in relation to, for example, FIG. 5. The neutral lines for the clean and contaminated power and the earth lines for the clean and contaminated power can be connected by bus bars. The switches 130 are three position switches. Each switch, in its central position is 'off'. Each switch in one of its end positions connects the live contaminated power line to the appropriate plug pin socket which is behind one of the openings 116 of the associated first set and in its other end position connects the live clean power line to the appropriate socket of the associated second set.

Associated with each depression 106 are six openings 116. Three openings constitute a first set of openings and the other three openings constitute a second set.

The switches 130 selectively supply contaminated power to the sockets behind the openings of the first set and clean power to the sockets behind the openings of the second set. The base member 100 thus provides first and second sets of plug pin receiving openings, each first set being grouped, at the rear of the associated depression, with a second set.

The module 102 is plugged in, as illustrated in FIG. 13, by presenting it to the wall 114 at a slight inclination. As the pins 138 enter the openings 116, the latching element 144 moves over, and then behind, the retaining element 110. As the module is then pressed down the tongue 108 is distorted and the detent 112 engages over the hook 146. The tongue 108 presses the module upwardly so that the detent 112 and hook 146 are firmly engaged with one another.

To remove a module, the latching element 144 is pressed inwardly so that its hook 146 disengages from the detent 112. The tongue 108, in tending to return to its undeformed condition, lifts the module to the angle shown in FIG. 13 so that its pins 138 can readily be withdrawn from the openings 126. A vertical pull on the module 102, such as occurs when a plug is pulled out, does not detach the module 102 from the base member 100.

We claim:

1. A power supply structure which comprises a base member having a first power input connection, a plurality of first sets of plug pin receiving openings with first electrically conductive plug pin receiving sockets behind them, said first power input connection being electrically connected to said first electrically conductive plug in receiving sockets behind said first sets of openings, a second power input connection, a plurality of second sets of plug pin receiving openings with second electrically conductive plug pin receiving sockets behind them, said second power input connection being electrically connected to said second electrically conductive plug receiving sockets behind said second sets of openings, the first and second sets of openings being grouped so that each first set is associated with a second set, (first means . . . the socket) said first input connection and said first electrically conductive sockets being electrically isolated from said second input connection and said second electrically conductive sockets, and a plurality of modules each of which includes pins for insertion into said sets of openings and plug pin receiving openings into which plugs on power leads can be inserted.

2. A structure according to claim 1, in which the pins of each module can, in a first position of orientation with respect to the base member, be plugged into a selected one of said first sets and can, in a second position of orientation, be plugged into a selected one of said second sets.

3. A structure according to claim 2, in which the pins of each module project downwardly from a bottom wall thereof and said plug pin receiving openings are in the top wall thereof, said structure including first and second means for respectively electrically connecting the first sockets to one another and the second sockets to one another, said sets of plug pin receiving openings of the base member being in a first horizontal wall of said base member with said plug pin receiving sockets and said first and second means below said wall and between said wall and a second, lower horizontal wall of the base member.

4. A structure according to claim 3, in which said base member has walls bounding upwardly open spaces in which said modules fit, said walls having undercuts, and in which said modules include manually displaceable latching elements which engage with said undercuts as each module is inserted into a respective one of the spaces, said latching elements being displaced manually to release each module from the base member.

5. A structure according to claim 3, and which comprises a plurality of elongate bus bars behind said openings of the base member, each bus bar being of strip metal which is deformed at intervals to form open-sided loops, said loops constituting said sockets, and portion of the bus bars between the sockets constituting said first and second means.

6. A structure according to claim 1, in which each module comprises a neutral pin, a negative pin and two positive pins, only one of the positive pins, said neutral pin and said negative pin entering sockets as said pins are inserted into said sets of openings.

7. A structure according to claim 1, and including elements bounding compartments behind said openings of the base member and shutters confined to said compartments, each shutter being in two parts and each part including a ramp surface and a resiliently deformable portion which bears on walling of each said compartment, the ramp surfaces being V-shaped and said portion urging said shutter parts towards one another.

8. A structure according to claim 1, in which each module includes a pair of normally open contacts and a pair of lights each of which is in series with one of said contacts, and said base has pairs of non-conductive pins which enter a respective one of the modules as said pins of that module enter an opening of one of the first and second sets of openings and close one of the contacts whereby only that one of said lights which is associated with that contact can be illuminated whilst the associated contact is closed.

9. A structure as claimed in claim 1, wherein each module has first and second sets of pins for insertion into said sockets, the number of pins of each module equalling the total number of openings of grouped first and second sets of openings, and the base member further including switch means associated with each grouped first and second set for selectively supplying power to either the sockets behind the first group of openings or the sockets behind the second group of openings.

10. A structure according to claim 9, in which said first and second sets of plug pin receiving openings are in an upright wall of the base member and in which said base member includes a base wall which incorporates resiliently deflectable tongues for urging said modules upwardly, said base member further including retaining elements, said tongues pressing said modules against said retaining elements, the modules including resiliently displaceable latching elements which cooperate with said retaining elements.

11. A structure according to claim 10, in which said first and second sets of pins of each module protrude from a side face of the respective module and said plug pin receiving openings of said receptive module are in the top face thereof.

12. A structure according to claim 1 in which the shape of the first power input connection is different than the shape of the second power input connection whereby a connector which is compatible with one of said connections is incompatible with the other of said connections.

13. A power supply structure which comprises:

a base member having a first power input connection, a plurality of first sets of four plug pin receiving openings with first electrically conductive plug pin receiving sockets behind three of them, said first power input connection being electrically connected to said first electrically conductive plug pin receiving sockets for supplying power to said first sockets, a second power input connection, a plurality of second set of four plug pin receiving openings with second electrically conductive plug pin receiving sockets behind three of them, said second power input connection being electrically connected to said second electrically conductive plug pin receiving sockets, said first input connection and said first electrically conductive sockets being electrically isolated from said second input connection and said second electrically conductive sockets, and a plurality of modules each of which includes four pins for insertion into said sets of openings and further includes plug pin receiving openings into which plugs on power leads can be inserted, the pins of each module being two live pins, a neutral pin and a negative pin and said openings being arranged so that regardless of which set of openings said pins are inserted into one of said positive pins, said neutral pin and said negative pin enter sockets, one of the two positive pins being in a socket when one of the modules is inserted into one of the first sets of openings and the other of the two positive pins being in a socket when the pins are inserted into one of the second sets of openings.

14. A structure according to claim 13, in which each module includes a pair of normally open contacts and a pair of lights each of which is in series with one of said contacts, and said base member has pairs of non-conductive pins which enter that one of the modules which is being plugged into the base member as said pins of that module enter the openings in the base member and close one of the contacts whereby only that one of said lights which is associated with that contact can be illuminated whilst the associated contact is closed.

15. A power supply structure comprising:

a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings being grouped so that each first set is associated with a second set, first means electrically connecting the sockets behind the first sets of openings for supplying power to these sockets, second means electrically connecting the sockets behind the second sets of openings for supplying power to the sockets, and a plurality of modules each of which includes pins for insertion into said sets of openings and plug pin receiving openings into which plugs on power leads can be inserted, wherein the pins of each module can, in a first position of orientation with respect tot he base member, be plugged into a selected one of said first sets and can, in a second position of orientation, be plugged into a selected one of said second sets, wherein the pins of each module project downwardly from a bottom wall thereof and said plug pin receiving openings are in the top wall thereof, said sets of plug pin receiving openings of the base member being in a first horizontal wall of said base member with said plug pin receiving sockets and said first and second means below said wall and between said wall and a second, lower horizontal wall of the base member, wherein said base member has walls bounding upwardly open spaces in which said modules fit, said walls having undercuts, and wherein said modules include manually displaceable latching elements which engage with said undercuts as each module is inserted into one of said spaces, said latching elements being displaced manually to release each module from the base member.

16. A power supply structure comprising:

a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings being grouped so that each first set is associated with a second set, first means electrically connecting the sockets behind the first sets of openings for supplying power to these sockets, second means electrically connecting the sockets behind the second sets of openings for supplying power to the sockets, a plurality of modules each of which includes pins for insertion into said sets of openings and plug pin receiving openings into which plugs on power leads can be inserted, and a plurality of elongate bus bars behind said openings of the base member, the bus bars constituting said first and second means, each bus bar being of strip metal which is deformed at intervals to form open-sided loops, said loops constituting said sockets.

17. A power supply structure comprising:

a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings behind grouped so that each first set is associated with a second set, first means electrically connecting the sockets behind the first sets of openings for supplying power to these sockets, second means electrically connecting the sockets behind the second sets of openings for supplying power to the sockets, a plurality of modules each of which includes pins for insertion into said sets of openings and plug pin receiving openings into which plugs on power leads can be inserted, and elements bounding compartments behind said openings of the base member and shutters confined to said compartments, each shutter being in two parts and each part including a ramp surface and a resiliently deformable portion which bears on walling of said compartment, the ramp surfaces being V-shaped and said portions urging said shutter parts towards one another.

18. A power supply structure comprising:

a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings being grouped so that each first set is associated with a second set, first means electrically connecting the sockets behind the first sets of openings for supplying power to these sockets, second means electrically connecting the sockets behind the second sets of openings for supplying power to the sockets, and a plurality of modules each of which includes pins for insertion into said sets of openings and plug pin receiving openings into which plugs on power leads can be inserted, wherein each module includes a pair of normally open contacts and a pair of lights each of which is in series with one of said contacts, and said base has pairs of non-conductive pins which enter a respective module as said pins of that respective module enter the openings in the base member and close one of the contacts whereby only that one of said lights which is associated with that contact can be illuminated while the associated contact is closed.

19. A power supply structure comprising;

a base member having a plurality of first sets of plug pin receiving openings with electrically conductive plug pin receiving sockets behind them, a plurality of second sets of plug pin receiving openings with electrically conductive plug pin receiving sockets behind them, the first and second sets of openings being grouped so that each first set is associated with a second set, first means electrically connecting the sockets behind the first sets of openings for supplying power to these sockets, second means electrically connecting the sockets behind the second sets of openings for supplying power to the sockets, and a plurality of modules each of which includes pins for insertion into said sets of openings and plug pin receiving openings into which plugs on power leads can be inserted, wherein each module has first and second sets of pins for insertion into said sockets, the number of pins of each module equalling the total number of openings of grouped first and second sets of openings, said base member further including switch means associated with each grouped first and second set for selectively supplying power to either the sockets behind the first group of openings or the sockets behind the second group of openings, wherein said first and second sets of plug pin receiving openings are in an upright wall of the base member, and wherein said base member includes a base wall which incorporates resiliently deflectable tongues for urging said modules upwardly, said base member further including retaining elements, said tongues pressing said modules against said retaining elements, and wherein the modules include resiliently displaceable latching elements which co-operate with said retaining elements.

20. A structure according to claim 19, in which said first and second sets of pins of each module protrude from a side face thereof and said plug pin receiving openings of each module are in the top face thereof.

* * * * *